(12) United States Patent
Schauer et al.

(10) Patent No.: US 7,101,794 B2
(45) Date of Patent: Sep. 5, 2006

(54) COATED SEMICONDUCTOR WAFER, AND PROCESS AND DEVICE FOR PRODUCING THE SEMICONDUCTOR WAFER

(75) Inventors: Reinhard Schauer, Laufen (DE); Norbert Werner, Tengling (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 10/854,649

(22) Filed: May 26, 2004

(65) Prior Publication Data

US 2004/0266181 A1 Dec. 30, 2004

(30) Foreign Application Priority Data

Jun. 26, 2003 (DE) ................ 103 28 842

(51) Int. Cl.
*H01L 21/44* (2006.01)
(52) U.S. Cl. ............... 438/680; 257/E21.575; 118/732
(58) Field of Classification Search ........ 438/680, 438/758, 789, 790; 118/732; 257/E21.575
See application file for complete search history.

(56) References Cited

U.S. PATENT DOCUMENTS

| | | | |
|---|---|---|---|
| 4,661,199 A | 4/1987 | Looney et al. ............ 118/725 |
| 5,462,800 A * | 10/1995 | Yamazaki et al. .......... 428/408 |
| 5,837,631 A * | 11/1998 | Elstner et al. ................ 501/90 |
| 6,129,047 A | 10/2000 | Nakamura ................... 118/725 |
| 2001/0003620 A1 * | 6/2001 | Dubots et al. .............. 428/446 |
| 2001/0037761 A1 | 11/2001 | Ries et al. ................... 117/200 |
| 2003/0041799 A1 | 3/2003 | Yang et al. .................. 117/200 |
| 2005/0000449 A1 * | 1/2005 | Ishibashi et al. ............ 118/728 |

FOREIGN PATENT DOCUMENTS

| | | |
|---|---|---|
| EP | 0 992 608 A1 | 4/2000 |
| KR | 2000-5172 | 1/2000 |
| KR | 2000-28804 | 5/2000 |
| WO | WO 1997/36843 A1 | 10/1997 |

OTHER PUBLICATIONS

Derwent Patent Family history, 3 pages, DWPI, May 26, 2005.*

* cited by examiner

*Primary Examiner*—Caridad Everhart
(74) *Attorney, Agent, or Firm*—Brooks Kushman P.C.

(57) ABSTRACT

A susceptor for a semiconductor wafer to be placed on during deposition of a layer on a front surface of the semiconductor wafer by chemical vapor deposition (CVD), has a gas-permeable structure with a porosity of at least 15% and a density of from 0.5 to 1.5 g/cm³. There is also a semiconductor wafer having a back surface and a front surface which has been coated by chemical vapor deposition (CVD) and a polished or etched back surface. The nanotopography of the back surface, expressed as the height fluctuation PV (=peak to valley), is less than 5 nm. There is a process for producing the semiconductor wafer.

14 Claims, 3 Drawing Sheets

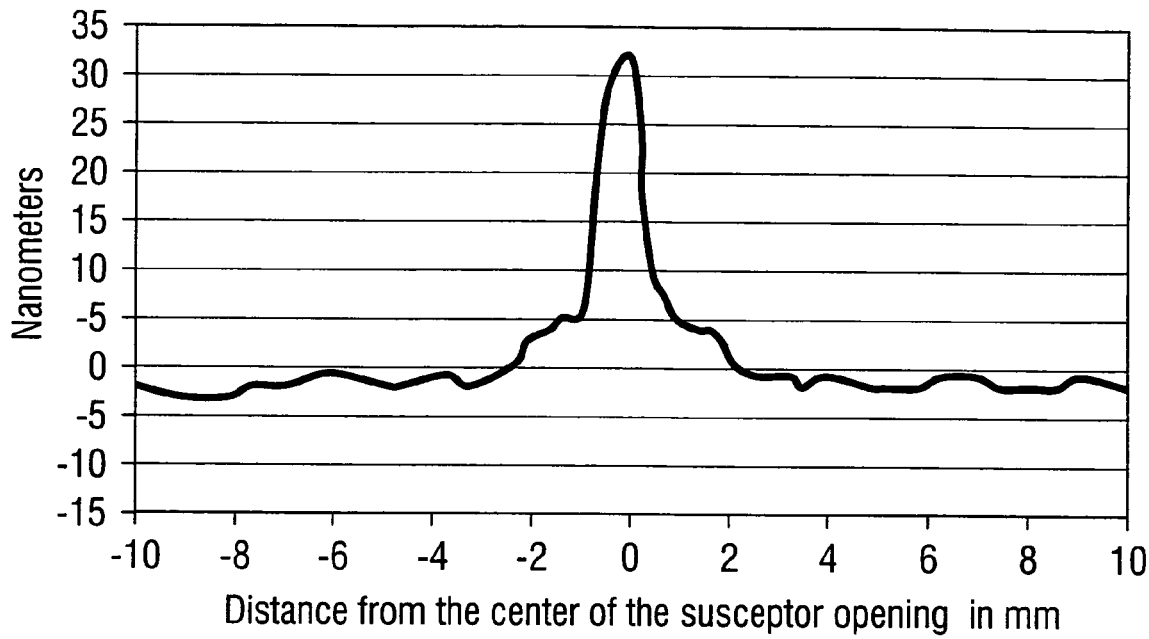
Fig. 3 Nanotopography of the wafer back surface for hole diameters of 0.5 mm
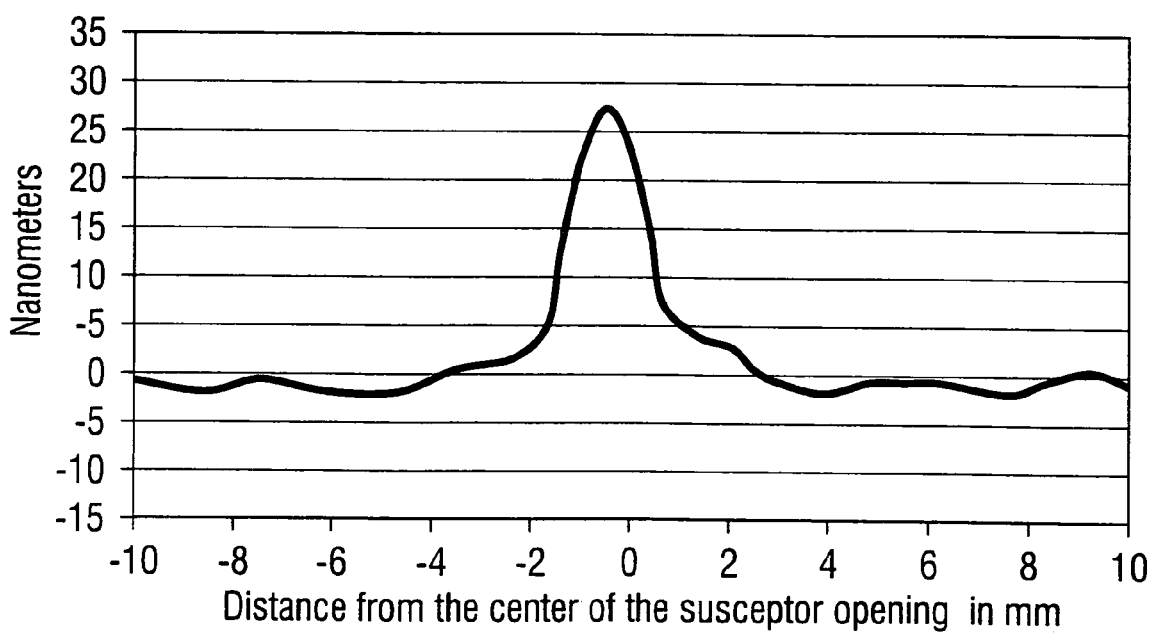
Fig. 4 Nanotopography of the wafer back surface for hole diameters of 1.0 mm

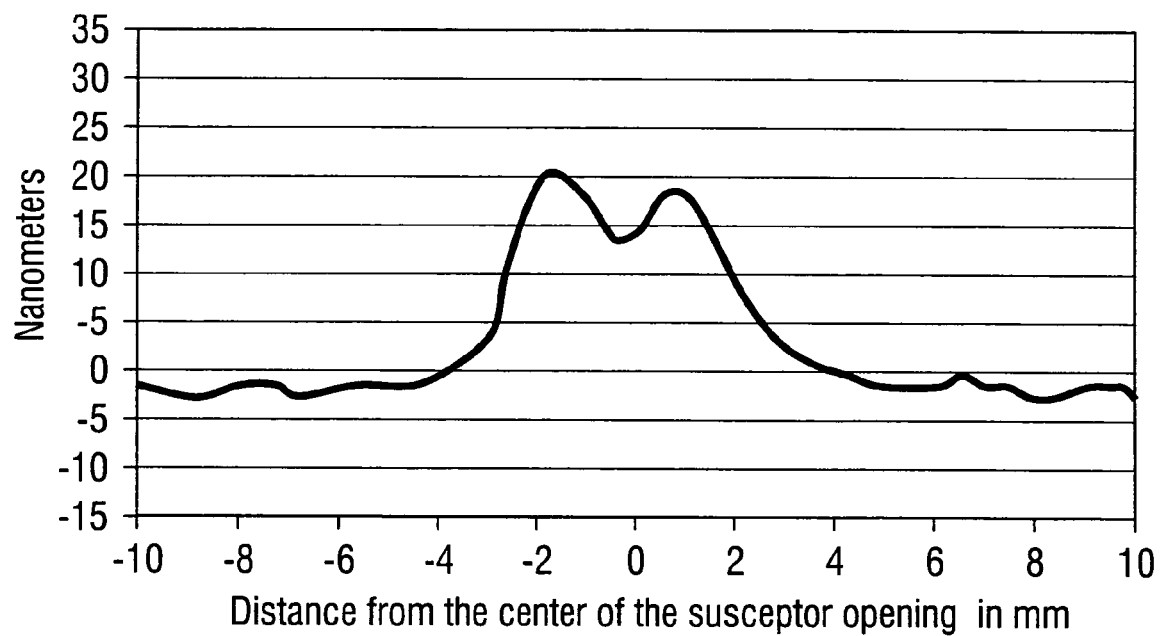
Fig. 5   Nanotopography of the wafer back surface for hole diameters of 1.5 mm

COATED SEMICONDUCTOR WAFER, AND PROCESS AND DEVICE FOR PRODUCING THE SEMICONDUCTOR WAFER

CROSS REFERENCE TO RELATED APPLICATIONS

Applicants claim priority under 35 U.S.C. §119 of German Application No. 103 28 842.2 filed Jun. 26, 2003.

BACKGROUND OF THE INVENTION

1. Field of the Invention

The present invention relates to a semiconductor wafer having a back surface and a front surface which has been coated by chemical vapor deposition (CVD) and a polished or etched back surface, and to a process for producing the semiconductor wafer. The invention also relates to a susceptor for a semiconductor wafer to be placed on during deposition of a layer on a front surface of the semiconductor wafer by chemical vapor deposition (CVD).

2. The Prior Art

Chemical vapor deposition (CVD), in particular deposition of an epitaxial layer on a silicon substrate wafer which has been polished on both sides, involves, inter alia, confronting two phenomena known as "autodoping" and "halo". In the case of "autodoping", dopants pass from the back surface of the semiconductor wafer via the gas phase into the deposition gas which is passed over the front surface of the semiconductor wafer. They are then incorporated in the epitaxial layer predominantly in the edge region of the front surface of the semiconductor wafer. This will thereby cause a more or less pronounced, undesired radial fluctuation in the conductivity of the epitaxial layer.

The term "halo" is to be understood as meaning a scattered light effect which is caused by light-scattering structures on the back surface of the semiconductor wafer and manifests itself when the back surface of the semiconductor wafer is irradiated with a focused light beam. The structures mark transitions on the back surface of the semiconductor wafer at which regions with a native oxide layer adjoin regions where an oxide layer of this type is not present. The likewise undesired transitions occur if the removal of the native oxide layer during a preheating phase known as the "prebake" prior to the actual deposition phase was incomplete.

To avoid problems with autodoping, it is proposed in U.S. Pat. No. 6,129,047 to provide slots in the base of the pocket of the susceptor which receives the semiconductor wafer. These slots are arranged at the outer edge of the base. Dopants which diffuse out from the back surface of the semiconductor wafer can be removed from the reactor through the slots without first passing to the front surface of the semiconductor wafer. According to US 2001/0037761 A1, there are small bores in the entire base of the susceptor for the same purpose. Moreover, the removal of the dopant which diffuses out from the back surface of the semiconductor wafer is assisted by sweeping with a purge gas. Both measures also act against halo formation, since they facilitate the removal of the native oxide layer on account of the fact that gaseous reaction products which are formed during dissolution of the native oxide are likewise conveyed away through the holes in the base and with the assistance of the stream of purge gas.

However, the use of the susceptor described is not altogether without problems, since the holes have an effect on the temperature field on the back surface and the front surface of the semiconductor wafer. If the diameter of the holes in the base of the susceptor exceeds a certain size, this has an adverse effect on the nanotopography of the front surface of the semiconductor wafer. The term nanotopography is used to describe height fluctuations in the nanometer range, measured over a lateral area of from 0.5 to 10 mm. The temperature fluctuations caused by the holes, during deposition of the epitaxial layer on the front surface of the semiconductor wafer, lead to locally differing deposition rates and ultimately to the abovementioned height fluctuations. To avoid this problem, it is proposed in US 2001/0037761 A1 to limit the diameter of the holes and to make the temperature field more uniform by adapting the power of the lamp heating.

However, these measures are only effective with regard to the front surface of the semiconductor wafer. As the inventors of the present invention have established, the nanotopography values of the back surface of the semiconductor wafer even become worse the smaller the diameter of the holes in the susceptor is selected to be. The presence of the holes means that the temperature field on the back surface of the semiconductor wafer remains so uneven that local etching, caused by purge gas, such as for example hydrogen, and local deposition, caused by deposition gas reaching the back surface of the semiconductor wafer, occur. Both phenomena have an adverse effect on the nanotopography of the back surface, which cannot be tolerated since even unevenness on the back surface of the semiconductor wafer can cause focusing problems for the stepper during fabrication of electronic components on the front surface of the semiconductor wafer.

SUMMARY OF THE INVENTION

Therefore, it is an object of the present invention to show how autodoping, halo and a disadvantageous nanotopography of the front surface and the back surface can be adequately avoided.

The present invention achieves this object by providing a semiconductor wafer having a back surface and a front surface which has been coated by chemical vapor deposition (CVD) and a polished or etched back surface, wherein the nanotopography of the back surface, expressed as the height fluctuation PV (=peak to valley), is less than 5 nm.

The semiconductor wafer is preferably a silicon substrate wafer with an epitaxially deposited layer on the front surface. The back surface of the coated semiconductor wafer is polished or etched. The substrate wafer is preferably p-doped or n-doped, particularly preferably p-doped with boron as dopant, in which case the degree of doping may be p−, p, p+ and p++. A degree of doping p+, which corresponds to a conductivity of approximately 0.005 to approximately 0.03 Ohm*cm, is particularly preferred. The epitaxial layer is preferably likewise p-doped, particularly preferably with boron as dopant, and preferably has a degree of doping p, which corresponds to a conductivity of approximately 1 to approximately 20 Ohm*cm. The thickness of the epitaxial layer is preferably 0.1 µm to 100 µm and depends primarily on the intended use. The nanotopography of the front surface of the coated semiconductor wafer, based on square measurement sites with a standard surface area of 0.5 mm*0.5 mm, 2 mm*2 mm or 10 mm*10 mm, is preferably less than 10 nm, particularly preferably less than 5 nm. The nanotopography of the back surface of the semiconductor wafer is less than 5 nm, preferably based on a measurement window with a surface area of 10 mm*10 mm.

The invention also relates to a process for producing a semiconductor wafer having a layer deposited on a front surface by chemical vapor deposition (CVD) and a polished or etched back surface. The semiconductor wafer, for deposition of the layer, is placed on a susceptor, so that the back surface of the semiconductor wafer faces a base of the susceptor. Thus any gaseous substances are passed from a region over the back surface of the semiconductor wafer substantially only through pores in the susceptor into a region over a back surface of the susceptor.

The method of the invention therefore differs from known methods in particular by virtue of the use of a susceptor with a porous structure which has a gas permeability which is sufficient for the desired gas transport. The effect of the susceptor makes its presence felt even as early as during the preheating phase, when the substrate wafer is preheated and exposed to a purge gas, consisting of an inert gas (noble gas or nitrogen) and/or a reducing gas (hydrogen), in order to remove the native oxide layer.

The gaseous reaction products which are formed during dissolution of the oxide layer escape, as does dopant diffusing out of the substrate wafer, through the pores of the susceptor to the back surface of the susceptor. There they are taken up by the stream of purge gas and are removed from the reactor. After removal of the oxide layer, hydrogen chloride can be added to the purge gas, preferably in order to smooth the front surface of the semiconductor wafer prior to the deposition of the epitaxial layer. For deposition of the epitaxial layer, the substrate wafer is brought to deposition temperature and the front surface of the substrate wafer is brought into contact with a deposition gas, while the back surface of the substrate wafer preferably continues to be exposed to the influence of the purge gas. The deposition gas contains compounds which, after their chemical dissociation, provide the layer-forming substances. These substances preferably include silicon, germanium and dopants, such as boron. A deposition gas containing trichlorosilane, hydrogen and diborane is particularly preferred. After deposition of the epitaxial layer, the coated semiconductor wafer is cooled, for example in a stream of hydrogen which is passed through the reactor.

Finally, the invention also relates to a susceptor for a semiconductor wafer to be placed on during deposition of a layer on a front surface of the semiconductor wafer by chemical vapor deposition (CVD), which susceptor has a gas-permeable structure with a porosity (pore volume/total volume) of at least 15%, particularly preferably at least 20%, and a density of from 0.5 to 1.5 g/cm$^3$, particularly preferably from 0.8 to 1.4 g/cm$^3$. The susceptor preferably consists of graphite or of graphite fibers having the abovementioned properties, particularly preferably of graphite coated with silicon carbide or graphite fibers coated with silicon carbide having the abovementioned properties.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawing, wherein similar reference characters denote similar elements throughout the several views:

FIG. 3 shows the height deviation of the wafer back surface for hole diameters of 0.5 mm as a function of the distance from the center of the susceptor opening;

FIG. 4 shows the height deviation of the back surface for hole diameters of 1.0 mm as a function of the distance from the center of the susceptor opening; and FIG. 5 shows the height deviation of the wafer back surface for hole diameters of 1.5 mm as a function of the distance from the center of the susceptor opening.

DETAILED DESCRIPTION OF PREFERRED EMBODIMENTS

Figure 1:
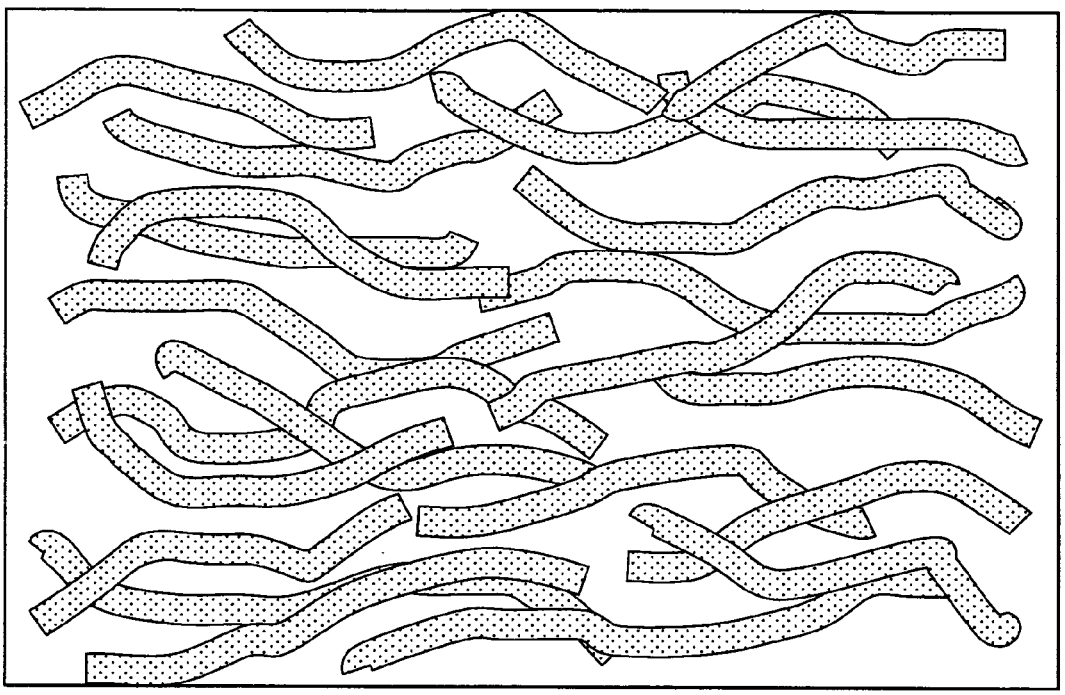
FIG. 1 diagrammatically shows a cross-sectional view through a susceptor according to the invention with a fiber structure.
Figure 2:
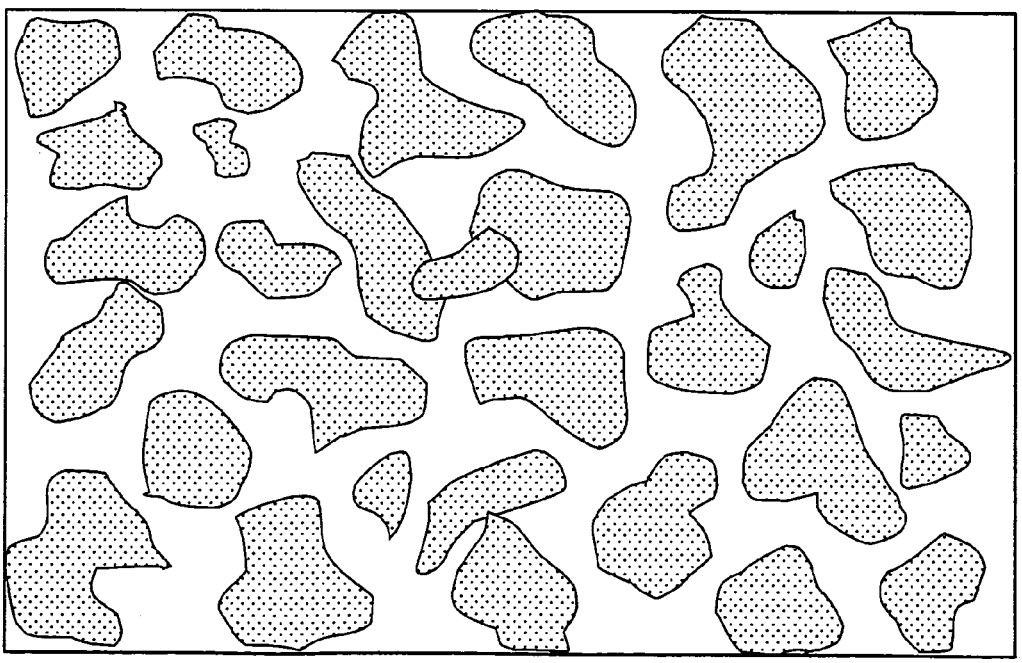
FIG. 2 shows a cross-sectional view of a susceptor according to the invention with a particle structure.

The graphite fibers may be in an ordered structure (isotropic) or in an unordered structure (anisotropic). If the fibers are coated with silicon carbide, it is preferable for the thickness of the silicon carbide layer to be greater at the surface of the susceptor than in the interior of the susceptor. The required porosity and density of the susceptor material can be set by suitable compacting of fibers or particles during production of the susceptor. The susceptor is preferably in plate-like form with a pocket for accommodating the semiconductor wafer, so that after the semiconductor wafer has been placed onto the susceptor, the back surface of the semiconductor wafer is facing the base of the susceptor.

The base is preferably continuous and permeable to gas only on account of the porosity of the susceptor material. However, it is possible for slot-like passages to be present at the outer edge of the pocket, as well as passages in the base of the susceptor for pins for raising and lowering the semiconductor wafer. However, the passages for the pins are practically closed by the presence of the pins while the susceptor is in use. The susceptor is preferably used in a single-wafer reactor and is preferably designed to hold semiconductor wafers with a diameter of 150 mm, 200 mm, 300 mm. It is particularly preferable to use the susceptor in conjunction with single-wafer reactors supplied by ASM and Applied Materials.

The invention is compared with the prior art below on the basis of an example. For the purpose of the comparison, a standard susceptor made from graphite coated with silicon carbide was provided with holes of different diameters (Comparative Example). The density of the material was approximately 1.85 g/cm$^3$. An identically shaped susceptor was produced from graphite felt coated with silicon carbide (Example). The material of this susceptor had a porosity of approximately 25% and a density of approximately 1.35 g/cm$^3$.

A plurality of substrate wafers made from silicon with p-doping and boron as dopant were provided in a single wafer reactor with a p+-doped (likewise with boron as dopant) epitaxial layer of silicon, with in each case one of the abovementioned types of susceptors being used. The deposition of the epitaxial layer was carried out in accordance with the prior art and included a conventional prebake step. The semiconductor wafers produced were tested for autodoping, halo and nanotopography of the front surface and back surface. Significant differences resulted only with regard to the nanotopography of the back surface. Here, semiconductor wafers which had been coated using a susceptor in accordance with the Comparative Example had considerably worse nanotopography values than semiconductor wafers produced in accordance with the Example of the invention. None of the semiconductor wafers of the Comparative Example achieved nanotopography values of below 5 nm, based on a measurement window with a surface area of 10*10 mm. As shown in FIGS. 3 to 5, the smaller the diameter of the holes in the susceptor, the greater the height deviation which it was possible to determine. By contrast, all the semiconductor wafers of the Example had nanotopography values of less than 5 nm on the back surface.

Accordingly, while a few embodiments of the present invention have been shown and described, it is to be understood that many changes and modifications may be made thereunto without departing from the spirit and scope of the invention as defined in the appended claims.

What is claimed is:

1. A susceptor for a semiconductor wafer to be employed during deposition of a layer on a front surface of the semiconductor wafer by chemical vapor deposition (CVD), said susceptor composed of a porous gas-permeable material with a porosity of at least 15% and a density of form 0.5 to 1.5 g/cm$^3$.

2. The susceptor of claim 1,
wherein the gas-permeable material comprises a porous layer of graphite fibers as a porous, gas-permeable material.

3. The susceptor of in claim 1,
wherein the gas-permeable material comprises a porous layer of graphite particles as a porous, gas-permeable material.

4. The susceptor of claim 1, further comprising through holes over a portion of the susceptor.

5. The susceptor of claim 1, wherein the porosity is random and uniform.

6. The susceptor of claim 1, further comprising through holes proximate an edge region of the susceptor.

7. The susceptor of claim 1, wherein said porous, gas-permeable material has a porosity of greater than 20%.

8. The susceptor of claim 1, wherein said porous, gas-permeable material has a density of from 0.8 to 1.4 g/cm$^3$.

9. The susceptor of claim 1, wherein said porous, gas-permeable material has a porosity greater than 20% and a density of from 0.8 to 1.4 g/m$^3$.

10. The susceptor of claim 1, having no through-holes.

11. The susceptor of claim 1,
which includes a coating of silicon carbide on a porous base material, said susceptor remaining porous.

12. The susceptor of claim 11,
wherein the thickness of the coating of silicon carbide decreases from a surface of the susceptor toward an interior of the susceptor.

13. A semiconductor wafer having a back surface and a front surface which has been coated by chemical vapor deposition (CVD) and a polished or etched back surface,
wherein the nanotopography of the back surface, expressed as the height fluctuation PV (=peak to valley), is less than 5 nm, and said semiconductor wafer is coated by chemical vapor deposition on its front surface employing a susceptor of claim 1.

14. A process for producing a semiconductor wafer having a layer deposited on a front surface of said wafer by chemical vapor deposition (CVD) and a polished or etched back surface of said wafer, comprising
placing the semiconductor wafer on a porous susceptor constructed of porous, gas-permeable material with a porosity of at least 15% and a density of from 0.5 to 1.5 g/cm for deposition of the layer, so that the back surface of the semiconductor wafer faces a base of the susceptor; and
passing gaseous substances from a region over the back surface of the semiconductor wafer substantially only through pores in the susceptor into a region over a back surface of the susceptor.

* * * * *